(12) United States Patent
Jang et al.

(10) Patent No.: US 8,319,535 B2
(45) Date of Patent: Nov. 27, 2012

(54) DELAY LOCKED LOOP

(75) Inventors: Jae-Min Jang, Gyeonggi-do (KR);
Yong-Ju Kim, Gyeonggi-do (KR);
Hae-Rang Choi, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 13/111,568

(22) Filed: May 19, 2011

(65) Prior Publication Data

US 2012/0194239 A1    Aug. 2, 2012

(30) Foreign Application Priority Data

Jan. 28, 2011    (KR) .................. 10-2011-0008807

(51) Int. Cl.
*H03L 7/06* (2006.01)
(52) U.S. Cl. ........................... 327/158; 327/149
(58) Field of Classification Search .................. 327/149, 327/158
See application file for complete search history.

(56) References Cited

U.S. PATENT DOCUMENTS

| | | | |
|---|---|---|---|
| 6,437,618 B2* | 8/2002 | Lee | 327/158 |
| 7,109,768 B2* | 9/2006 | Rashid | 327/170 |
| 7,308,592 B2* | 12/2007 | Schmunkamp et al. | 713/400 |
| 7,710,172 B2* | 5/2010 | Kuroki et al. | 327/158 |
| 2005/0285646 A1* | 12/2005 | Rashid | 327/170 |
| 2006/0184814 A1* | 8/2006 | Schmunkamp et al. | 713/500 |
| 2008/0122502 A1* | 5/2008 | Kim | 327/149 |
| 2009/0039930 A1* | 2/2009 | Kuroki et al. | 327/158 |
| 2010/0120389 A1* | 5/2010 | Blum | 455/208 |
| 2010/0271889 A1* | 10/2010 | Lin | 365/194 |

FOREIGN PATENT DOCUMENTS

| | | |
|---|---|---|
| KR | 1020080098197 | 11/2008 |
| KR | 1020090114989 | 11/2009 |
| KR | 1020110002230 | 1/2011 |
| KR | 1020110088961 | 8/2011 |

OTHER PUBLICATIONS

Notice of Allowance issued by the Korean Intellectual Property Office on Jul. 27, 2012.

* cited by examiner

*Primary Examiner* — Lincoln Donovan
(74) *Attorney, Agent, or Firm* — IP & T Group LLP

(57) ABSTRACT

A DLL circuit includes a common delay line configured to generate a delay locked clock by selectively delaying a source clock by one or more unit delays in response to a first delay control code or a second delay control code, a clock cycle detector configured to compare a phase of the source clock with a phase of the delay locked clock in a cycle detection mode and generate the first delay control code corresponding to a delay amount of a cycle of the source clock based on a result of comparing the phases of the source and delay locked clocks, a feedback delay configured to delay the delay locked clock and output a feedback clock, and a delay amount controller configured to compare the phase of the source clock with a phase of the feedback clock in a delay locking mode and change the second delay control code based on a result of comparing the source and feedback clocks.

16 Claims, 5 Drawing Sheets

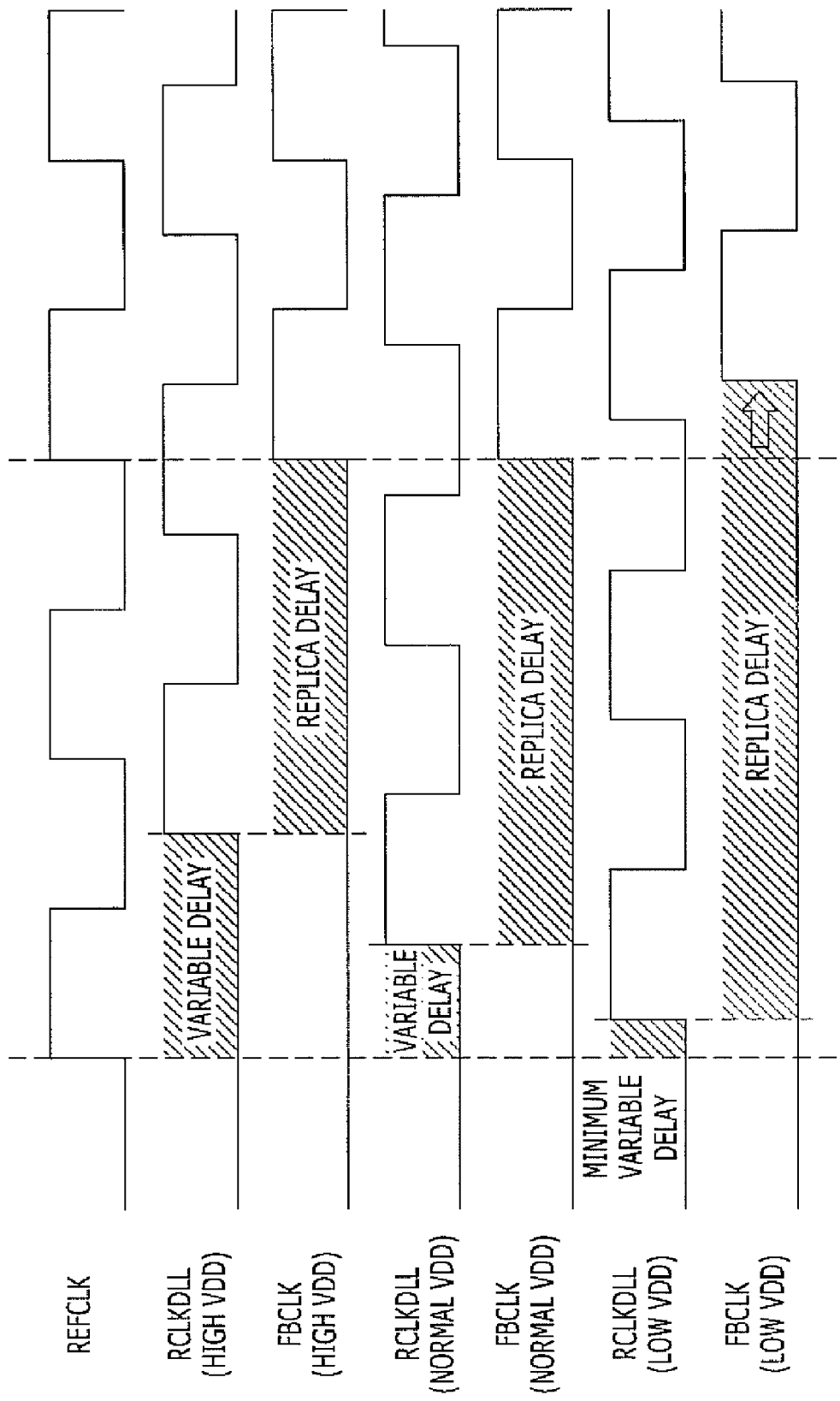

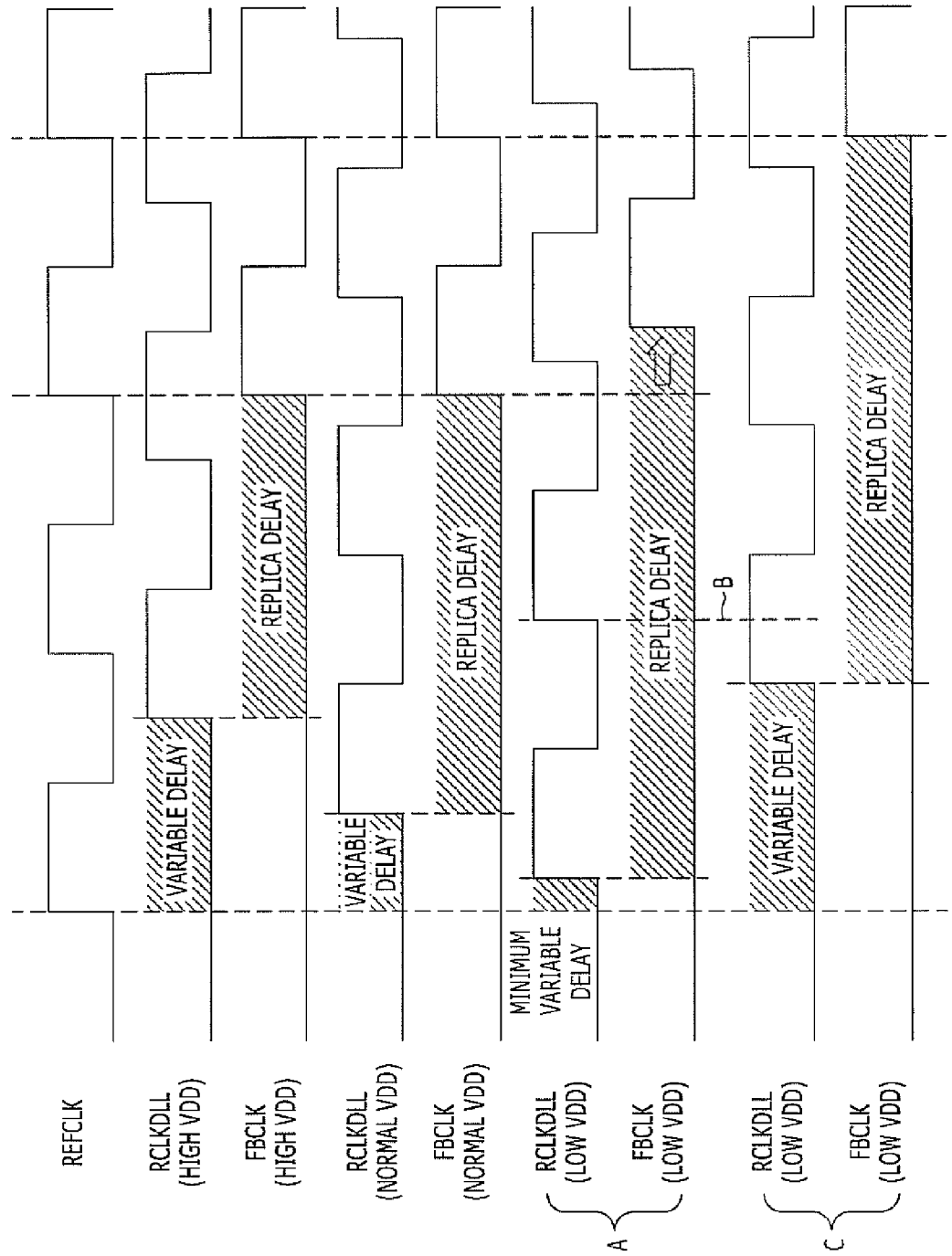

DELAY LOCKED LOOP

CROSS-REFERENCE TO RELATED APPLICATIONS

The present application claims priority of Korean Patent Application No. 10-2011-0008807, filed on Jan. 28, 2011, which is incorporated herein by reference in its entirety.

BACKGROUND

1. Field

Exemplary embodiments of the present invention relate to a semiconductor design technology, and more particularly, to a delay locked loop.

2. Description of the Related Art

Synchronous semiconductor memory devices such as a Double Data Rate Synchronous Dynamic Random Access Memory (DDR SDRAM) device transfer data to/from external devices by using an internal clock signal. The internal clock signal is synchronized with an external clock signal inputted from an external device such as a memory controller CTRL in order to input/output the data in synchronization with the external clock signal. Therefore, the data may be stably transferred between the memory devices and the external devices.

Here, the data is outputted from the memory device in synchronization with the internal clock signal. The internal clock signal is generated in synchronization with the external clock signal, but the internal clock signal may be delayed as it passes through the constituent elements in the inside of the memory device. When the internal clock signal is outputted out of the memory device, it may not be synchronized with the external clock signal.

Therefore, the internal clock signal which is delayed while passing through the constituent elements is to be adjusted based on the edge or center of the external clock signal in order to stably transfer of the data outputted from the memory device. In order to synchronize the internal clock with the external clock, the internal clock signal is adjusted by compensating for the time taken in loading the data on a bus.

Examples of a clock synchronization circuit which performs such operation include a phase locked loop (PLL) circuit and a delay locked loop (DLL) circuit. The PLL circuit is used when the frequency of the external clock signal is different from the frequency of the internal clock signal, because the frequency doubling function is to be used. However, when the frequency of the external clock signal is the same as the frequency of the internal clock signal, the DLL circuit is usually used because the DLL circuit is less affected by noise and may be realized in a smaller area than the PLL circuit. In other words, a synchronous semiconductor memory device, such as a DDR SDRAM device, may use a DLL circuit as the frequency of the external clock signal is the same as the frequency of the internal clock signal.

Meanwhile, the synchronous semiconductor memory device, such as a DDR SDRAM device, performs an operation of inputting/outputting data based on the rising edge and falling edge of the internal clock signal. In this case, the duty cycle of the internal clock signal becomes a significant factor that may maximally maintain timing margin in a high-performance memory system.

To be specific, when the duty cycle of the internal clock signal is not accurately maintained at 50%, an error equal to an offset from the 50% may occur and thus decrease the timing margin of the high-performance memory system. Therefore, the synchronous semiconductor memory device may include a device for correcting the distortion of the duty cycle caused by a change of process, voltage and/or temperature. In short, a duty cycle correction circuit (DCC) is used in a DLL circuit to correct the duty cycle of the internal clock signal.

FIG. 1 is a block diagram illustrating a DLL circuit of a conventional semiconductor device.

Referring to FIG. 1, the DLL circuit 100 of a conventional semiconductor device includes a clock phase comparator 10, a delay controller 30, a variable delay line 50, a duty cycle corrector 90, and a delay replica modeler 70. The clock phase comparator 10 compares a phase of a feedback clock FBCLK with a phase of a source clock REFCLK to generate a phase comparison signal PD_OUT. The delay controller 30 generates a delay control signal DLY_CONT of which a value varies in response to the phase comparison signal PD_OUT. The variable delay line 50 delays the source clock REFCLK by delay amount $t_{VAR}$ corresponding to the delay control signal DLY_CONT and outputs a delay locked clock DLLCLK. The duty cycle corrector 90 corrects a duty cycle of the delay locked clock DLLCLK and drives a duty cycle-corrected delay locked clock RDLLCLK. The delay replica modeler 70 reflects actual delay amount $t_{REP}$ of the source clock REFCLK into a delay time of the duty cycle-corrected delay locked clock RDLLCLK and outputs a feedback clock FBCLK.

By performing the operation of the DLL circuit having the above structure, the sum of the delay amount $t_{VAR}$ of the variable delay line 50 and the delay amount $t_{REP}$ of the delay replica modeler 70 can be 'N' times of the cycle of the source clock REFCLK by properly controlling the delay amount $t_{VAR}$ of the variable delay line 50, even if the delay amount $t_{REP}$ of the delay replica modeler 70 is changed due to a change in the process, voltage, and/or temperature (PVT) environment. Here, N is a natural number greater than 1.

The delay amount $t_{VAR}$ of the variable delay line 50 includes a delay amount of the delay locked clock DLLCLK which is caused by the operation of the duty cycle corrector 90. In other words, although various constituent elements are omitted while the drawing is simplified for the sake of convenience in description, the delay amount $t_{VAR}$ of the variable delay line 50 may be seen as the sum of the delay amounts of all circuits that the source clock REFCLK passes through until it becomes the duty cycle-corrected delay locked clock RDLLCLK.

FIG. 2 is a timing diagram illustrating the features of the DLL circuit of the conventional semiconductor device shown in FIG. 1.

Referring to FIG. 2, the DLL circuit of the conventional semiconductor device performs an operation of varying the delay amount $t_{VAR}$ of the variable delay line 50 (i.e., a variable delay as shown in the drawings) to make the feedback clock FBCLK have the same phase as the phase of the source clock REFCLK when the source clock REFCLK applied to the DLL circuit is outputted as the feedback clock FBCLK after passing through the variable delay line 50 (the delay amount $t_{VAR}$) and the delay replica modeler 70 (the delay amount $t_{REP}$).

Here, the delay amount $t_{REP}$ of the delay replica modeler 70 (i.e., replica delay in the drawing) may be set to a value predetermined in the stage that the delay replica modeler 70 is designed. However, the delay amount $t_{REP}$ of the delay replica modeler 70 may become different from the predetermined value according to the level of external power source voltage VDD.

FIG. 2 illustrates timing diagrams of the source and feedback clocks REFCLK and FBCLK according to a level of an external power source voltage when a delay locking operation is terminated and thus the delay amount $t_{VAR}$ of the variable delay line 50 and the delay amount $t_{REP}$ of the delay replica modeler 70 are determined in the DLL circuit.

First, the delay amount $t_{REP}$ of the delay replica modeler 70 may become relatively small when the DLL circuit operates with a high-voltage external power source voltage HIGH VDD higher than a target level due to a change in the process, voltage and/or temperature. Therefore, the DLL circuit performs a delay locking operation in such a manner that the delay amount $t_{VAR}$ of the variable delay line 50 has a relatively great value so that the phase of the feedback clock FBCLK is the same as the phase of the source clock REFCLK after all.

Conversely, the delay amount $t_{REP}$ of the delay replica modeler 70 may become relatively great when the DLL circuit operates with a low-voltage external power source voltage LOW VDD lower than the target level due to a change in the process, voltage and/or temperature. Therefore, the DLL circuit performs a delay locking operation in such a manner that the delay amount $t_{VAR}$ of the variable delay line 50 has a relatively small value so that the phase of the feedback clock FBCLK is the same as the phase of the source clock REFCLK after all.

However, as illustrated in the drawing, the delay amount $t_{REP}$ of the delay replica modeler 70 is too great and thus, the phase of the feedback clock FBCLK may not be the same as the phase of the source clock REFCLK although the delay amount $t_{VAR}$ of the variable delay line 50 is maintained at the minimum variable delay amount.

This kind of phenomenon may be referred to as stuck failure occurring in the DLL circuit. The stuck failure may inevitably occur when a variable delay line operating in a linear type as the variable delay line 50 illustrated in FIG. 1 is used.

SUMMARY

An embodiment of the present invention is directed to a circuit that may prevent stuck failure from occurring in a delay locked loop (DLL) circuit of a semiconductor device.

In accordance with an aspect of the present invention, a delay locked loop (DLL) circuit includes: a common delay line configured to generate a delay locked clock by selectively delaying a source clock by one or more unit delays in response to a first delay control code or a second delay control code; a clock cycle detector configured to compare a phase of the source clock with a phase of the delay locked clock in a cycle detection mode and generate the first delay control code corresponding to a delay amount of a cycle of the source clock based on a result of comparing the phases of the source and delay locked clocks; a feedback delay configured to delay the delay locked clock and output a feedback clock; and a delay amount controller configured to compare the phase of the source clock with a phase of the feedback clock in a delay locking mode and change the second delay control code based on a result of comparing the source and feedback clocks.

BRIEF DESCRIPTION OF THE DRAWINGS

FIG. 2 is a timing diagram illustrating the features of the DLL circuit of the conventional semiconductor device shown in FIG. 1.

FIG. 4 is a timing diagram illustrating the DLL operations of the DLL circuits of the semiconductor device shown in FIGS. 3A and 3B.

DETAILED DESCRIPTION

Figure 1:
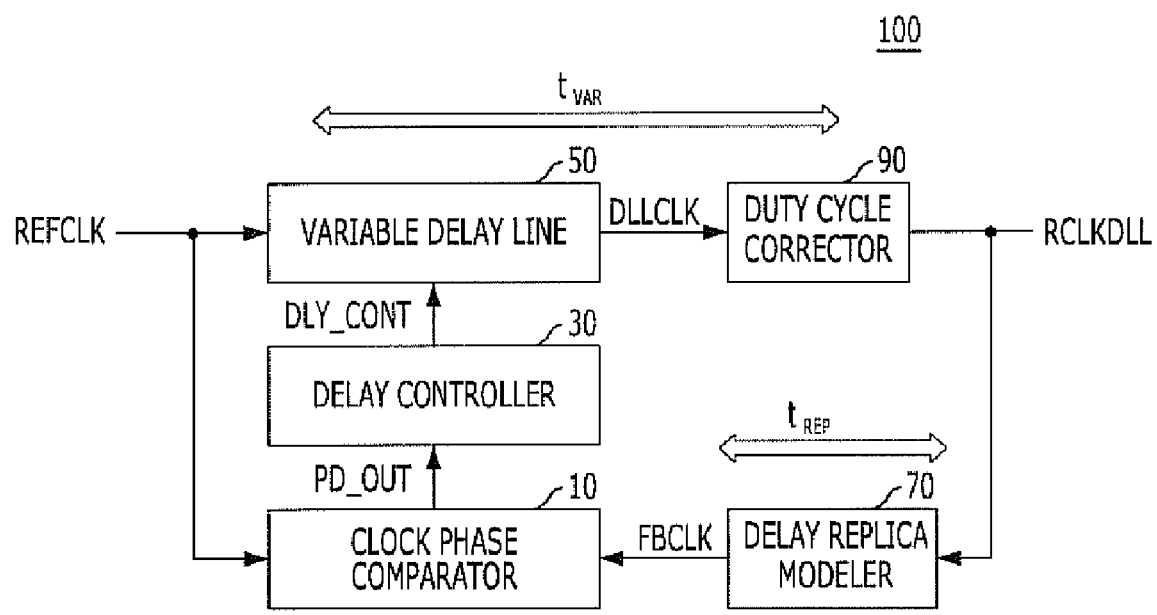
FIG. 1 is a block diagram illustrating a Delay Locked Loop (DLL) circuit of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3A:
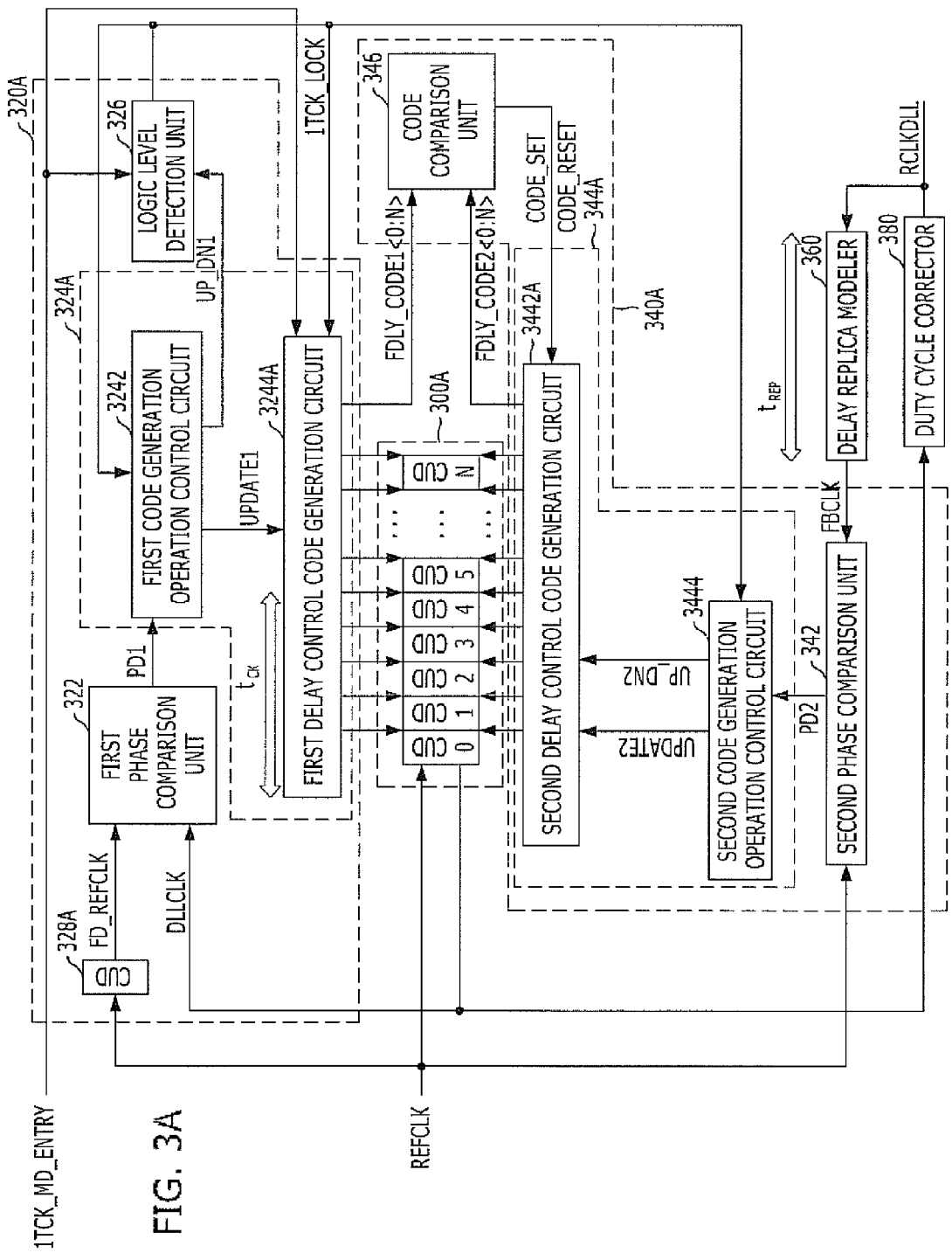
FIGS. 3A and 3B are block diagrams illustrating DLL circuits of a semiconductor device in accordance with an embodiment of the present invention.
Figure 3B:
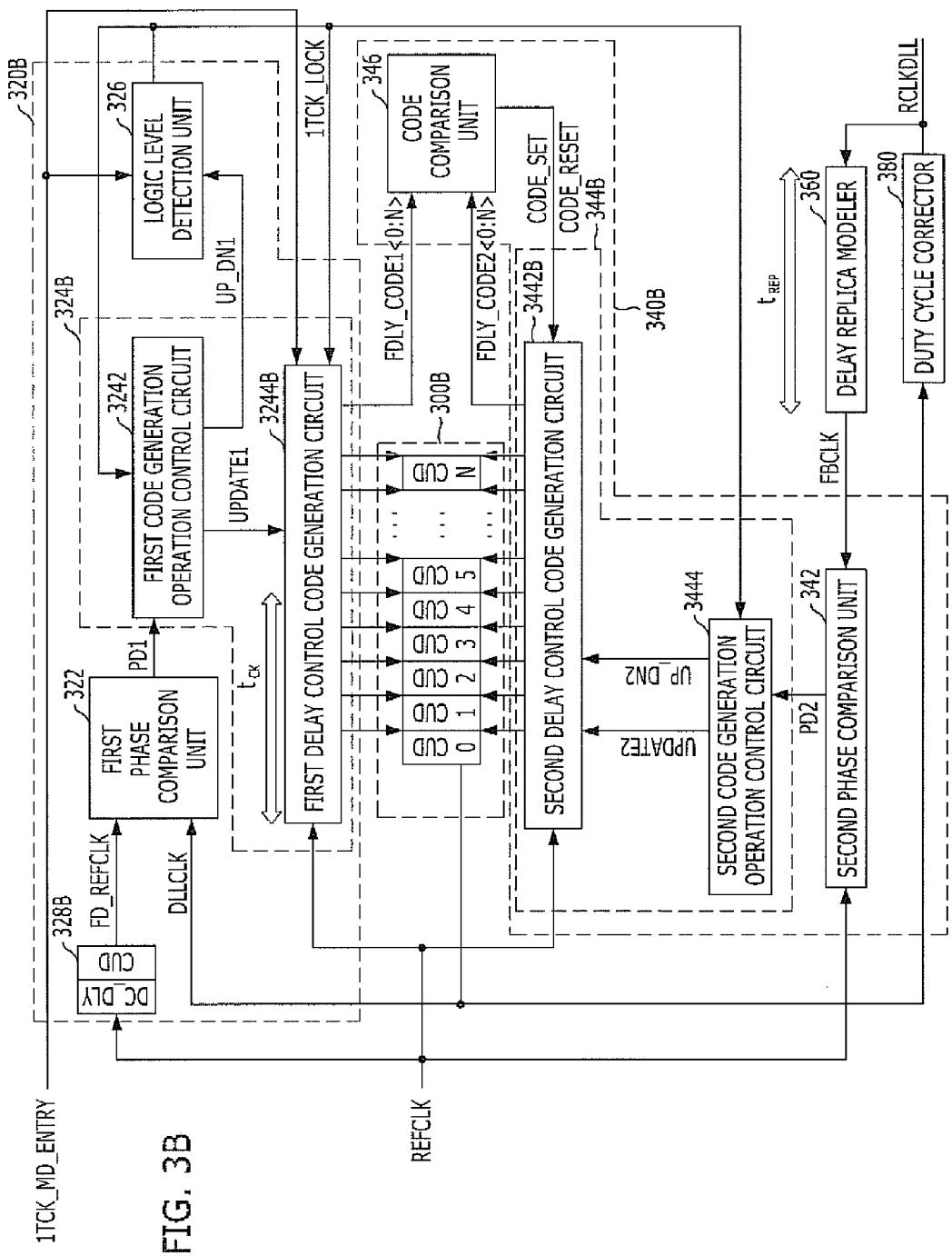

FIGS. 3A and 3B are block diagrams illustrating Delay Locked Loop (DLL) circuits of a semiconductor device in accordance with an embodiment of the present invention.

Referring to FIG. 3A, the DLL circuit of the semiconductor device in accordance with the embodiment of the present invention includes a common delay line 300A, a clock cycle detector 320A, a delay replica modeler 360, and a delay amount controller 340A. The common delay line 300A generates a delay locked clock DLLCLK by delaying a source clock REFCLK by a delay amount which varies by a delay unit CUD in response to a first delay control code FDLY_CODE1<0:N> or a second delay control code FDLY_CODE2<0:N>. The clock cycle detector 320A compares a phase of the source clock REFCLK with a phase of the delay locked clock DLLCLK in a 1tck cycle detection mode and detects a value of the first delay control code FDLY_CODE1<0:N> corresponding/equivalent to a delay amount of one cycle (1tck) of the source clock REFCLK based on the phase comparison result. The delay replica modeler 360 reflects actual delay conditions of a source clock path into delay amount of the delay locked clock DLLCLK and outputs a feedback clock FBCLK. The delay amount controller 340A compares a phase of the feedback clock FBCLK with the phase of the source clock REFCLK in a delay locking mode and varies a value of the second delay control code FDLY_CODE2<0:N> based on the phase comparison result. However, when the value of the second delay control code FDLY_CODE2<0:N> reaches a limit, the delay amount controller 340A varies the value of the second delay control code FDLY_CODE2<0:N> by the value of the first delay control code FDLY_CODE1<0:N>. Also, the DLL circuit further includes a duty cycle corrector 380 for correcting the duty cycle of the delay locked clock DLLCLK, drives a duty cycle-corrected delay locked clock RDLLCLK, and transfers it to the delay replica modeler 360.

Here, the delay replica modeler 360 is illustrated in the drawing to receive the duty cycle-corrected delay locked clock RDLLCLK and outputs a feedback clock FBCLK, and this structure may be changed according to the different design needs. Therefore, differently from the drawing, the delay locked clock DLLCLK may be directly applied to the delay replica modeler 360.

In short, in the structure illustrated in the drawing, the replica modeled delay amount of the delay replica modeler 360 includes the delay amount of the delay locked clock DLLCLK caused by the operation of the duty cycle corrector 380. However, in another structure which is different from the structure shown in the drawing according to different design needs, the replica modeled delay amount of the delay replica modeler 360 may not include the delay amount of the delay locked clock DLLCLK caused by the operation of the duty ratio corrector 380.

Among the constituent elements of the DLL circuit of the semiconductor device in accordance with the embodiment of the present invention, the common delay line 300A includes a plurality delay units CUD0, CUD1, CUD2, CU3, CUD4, CUD5, ..., CUDN−1, CUDN which are coupled with each other in the form of a chain and control the direction of transferring an input signal in response to the first delay control code FDLY_CODE1<0:N> or the second delay control code FDLY_CODE2<0:N>.

The clock cycle detector 320A includes a first phase comparison unit 322, a first code varying unit 324A, and a logic level detection unit 326. The first phase comparison unit 322 compares the phase of the delay locked clock DLLCLK with the phase of the source clock REFCLK. The first code varying unit 324A varies the value of the first delay control code FDLY_CODE1<0:N> in response to an output signal PD1 of the first phase comparison unit 322 during the enabled period of a detection operation control signal 1tck_LOCK, i.e., for the duration of the 1tck cycle detection mode. The logic level detection unit 326 detects the logic level of the output signal PD1 of the first phase comparison unit 322 and decides the value of the detection operation control signal 1tck_LOCK based on the detection result. Also, the clock cycle detector 320A further includes an initial clock delay unit 328A for delaying the source clock REFCLK by a predetermined number of delay units, which is the same as the delay amount of the number of delay units of the common delay line 300A in response to the minimum value of the first delay control code FDLY_CODE1<0:N>, and transferring the delayed source clock to the first phase comparison unit 322.

Here, the first code varying unit 324A includes a first delay control code generation circuit 3244A and a first code generation operation control circuit 3242. The first delay control code generation circuit 3244A increases the value of the first delay control code FDLY_CODE1<0:N> during the enablement of the detection operation control signal 1tck_LOCK, latches the value of the first delay control code FDLY_CODE1<0:N> during the disablement of the detection operation control signal 1tck_LOCK, and transfers the first delay control code FDLY_CODE1<0:N> to the common delay line 300A during the enablement of a first operation control signal UPDATE. The first code generation operation control circuit 3242 controls the first operation control signal UPDATE1 to have the same enablement duration as the detection operation control signal 1tck_LOCK, filters the output signal PD1 of the first phase comparison unit 322, and outputs a first delay amount increase/decrease signal UP_DN1.

The delay amount controller 340A includes a second phase comparison unit 342, a second code varying unit 344A, and a code comparison unit 346. The second phase comparison unit 342 compares the phase of the feedback clock FBCLK with the phase of the source clock REFCLK. The second code varying unit 344A varies the value of the second delay control code FDLY_CODE2<0:N> in response to cycle control signals CODE_SET and CODE_RESET and an output signal PD2 of the second phase comparison unit 342 during the disablement of a detection operation control signal 1tck_LOCK, i.e., for the duration of the delay locking mode. The code comparison unit 346 compares the value of the first delay control code FDLY_CODE1<0:N> with the value of the second delay control code FDLY_CODE2<0:N> and decides the values of the cycle control signals CODE_SET and CODE_RESET based on the comparison result.

Here, the second code varying unit 344A includes a second delay control code generation circuit 3442A and a second code generation operation control circuit 3444. The second delay control code generation circuit 3442A changes the value of the second delay control code FDLY_CODE2<0:N> in response to a second delay amount increase/decrease signal UP_DN2, where the value of the second delay control code FDLY_CODE2<0:N> varies by the value of the first delay control code FDLY_CODE1<0:N> in response to the cycle control signals CODE_SET and CODE_RESET, and transfers the value of the second delay control code to the common delay line 300A during the enablement of a second operation control signal UPDATE2. The second code generation operation control circuit 3444 controls the second operation control signal UPDATE2 to have the opposite enabled duration to the detection operation control signal 1tck_LOCK, filters the output signal PD2 of the second phase comparison unit 342, and outputs the second delay amount increase/decrease signal UP_DN2.

The operation of the DLL circuit of the semiconductor device in accordance with the embodiment of the present invention having the above-described structure is described as follows.

First, each of the delay units CUD0, CUD1, CUD2, CU3, CUD4, CUD5, ..., CUDN−1, CUDN included in the common delay line 300A delays a signal applied from the preceding delay unit by a delay unit CUD and transfers the delayed signal to the preceding delay unit or the following delay unit. The each of delay units delays a signal applied from the following delay unit by a delay unit CUD and transfers the delayed signal to the preceding delay unit. The delay units operate to receive the source clock REFCLK through the foremost delay unit CUD0 and output the delay locked clock DLLCLK.

In other words, each of the delay units CUD0, CUD1, CUD2, CU3, CUD4, CUD5, ..., CUDN−1, CUDN included in the common delay line 300A decides the direction to transfer the applied signal in response to the first delay control code FDLY_CODE1<0:N> or the second delay control code FDLY_CODE2<0:N>.

For example, if the common delay line 300A is to operate to delay the source clock REFCLK by a delay amount of 10*delay unit CUD (10*CUD) and output the delay locked clock DLLCLK, it is controlled that the fourth bit FDLY_CODE1<4> or FDLY_CODE2<4> of the first delay control code FDLY_CODE1<0:N> and the second delay control code FDLY_CODE2<0:N> is enabled and the rest bits FDLY_CODE1<0:3> and FDLY_CODE1<5:N>, or FDLY_CODE2<0:3> and FDLY_CODE2<5:N> are disabled. Therefore, the zeroth to third delay units CUD0, CUD1, CUD2, and CU3 among the multiple delay units CUD0, CUD1, CUD2, CU3, CUD4, CUD5, ..., CUDN−1, and CUDN performs an operation of delaying a signal applied from a signal input end INND and the preceding delay units CUD0, CUD1, and CUD2 by a delay unit and transferring the delayed signal to the following delay units CUD1, CUD2, CU3, and CUD4 and performs an operation of delaying a signal applied from the following delay units CUD1, CUD2, CU3, and CUD4 by a delay unit and transferring the delayed signal to the signal input end INND and the preceding delay units CUD0, CUD1, and CUD2. The fourth delay unit CUD4 delays the signal applied from the preceding delay unit CUD3 by a delay unit and transfers the delayed signal back to the preceding delay unit CUD3. Here, although the rest delay units CUD5, CUD6, ..., CUDN−1, and CUDN perform the same operation as the zeroth to third delay units CUD0, CUD1, CUD2, and CU3, they may not affect the signal delay operation at all because no signal is transferred through the fourth delay unit CUD4.

Among the constituent elements of the clock cycle detector 320A, the first phase comparison unit 322 operates to detect the logic level of the source clock REFCLK at a predetermined edge of the delay locked clock DLLCLK, which generally means a rising edge but may be a falling edge according to embodiments of the present invention.

Here, differently from the delay locked clock DLLCLK, the source clock REFCLK is applied to the first phase comparison unit 322 after passing through an initial clock delay unit 328A. The initial clock delay unit 328A is used because the delay amount of the common delay line 300A is not '0' even at the minimally maintained state when the first delay control code FDLY_CODE1<0:N> maintains the minimum value.

In short, to accurately detect one cycle 1tck of the source clock REFCLK, the source clock REFCLK and the delay locked clock DLLCLK are to be applied to the first phase comparison unit 322 while being able to be detected based on the fluctuation of the delay amount of the common delay line 300A. Therefore, this is to make the source clock REFCLK and the delay locked clock DLLCLK be inputted to the first phase comparison unit 322 in a state where the minimum variable delay amount of the common delay line 300A is removed. The minimum variable delay amount of the common delay line 300A is exemplarily illustrated in the drawing as a delay amount corresponding to one delay unit CUD and it may be set to a desired value at the design stage.

Among the constituent elements of the clock cycle detector 320A, the first code generation operation control circuit 3242 in the first code varying unit 324A simultaneously performs a first operation of controlling the first operation control signal UPDATE1 to have the same enabled duration as the detection operation control signal 1tck_LOCK and a second operation of filtering the output signal PD1 of the first phase comparison unit 322 and outputting the first delay amount increase/decrease signal UP_DN1.

To have a look at the first operation, the first operation control signal UPDATE1 is controlled to maintain an enabling state in response to the detection operation control signal 1tck_LOCK where the enabling state is maintained in the operation duration of the 1tck cycle detection mode. Conversely, the first operation control signal UPDATE1 is controlled to maintain a disabling state in response to the detection operation control signal 1tck_LOCK where the disabling state is maintained in the operation duration of the delay locking mode. In short, when the detection operation control signal 1tck_LOCK is enabled and an operation of detecting one cycle 1tck of the source clock REFCLK on the basis of a delay unit CUD is performed, the first operation control signal UPDATE1 is enabled to make the first delay control code FDLY_CODE1<0:N> vary according to the output signal PD1 of the first phase comparison unit 322.

Similarly, to have a look at the second operation, the output signal PD1 of the first phase comparison unit 322 is filtered and outputted as the first delay amount increase/decrease signal UP_DN1. Here, the filtering operation is an operation that may be configured differently according to the different design needs. For example, the first delay amount increase/decrease signal UP_DN1 of a logic low level may be set to transition to a logic high level when the output signal PD1 of the first phase comparison unit 322 becomes a logic high level in three consecutive times while the phases of the source clock REFCLK and the delay locked clock DLLCLK are not changed. At this time, if the output signal PD1 of the first phase comparison unit 322 transitions to a logic high level once or twice and then maintains the logic low level, the first delay amount increase/decrease signal UP_DN1 is maintained at the logic low level. In short, the filtering operation is to prevent the operation errors of the first phase comparison unit 322 caused by several environmental reasons from affecting the operation of the first code varying unit 324A. Of course, the output signal PD1 of the first phase comparison unit 322 and the first delay amount increase/decrease signal UP_DN1 may continue to have the same value in the ideal state.

Among the constituent elements of the clock cycle detector 320A, the first delay control code generation circuit 3244A in the first code varying unit 324A increases the value of the first delay control code FDLY_CODE1<0:N> during the enablement of the detection operation control signal 1tck_LOCK, and latches the value of the first delay control code FDLY_CODE1<0:N> during the disablement of the detection operation control signal 1tck_LOCK. Also, it transfers the first delay control code FDLY_CODE1<0:N> to the common delay line 300A during the enablement of the first operation control signal UPDATE1. Here, since the first operation control signal UPDATE1 is controlled to have the same enabled duration as the detection operation control signal 1tck_LOCK in the first code generation operation control circuit 3242, which is described above, the first delay control code FDLY_CODE1<0:N> is transferred to the common delay line 300A when it increases and is not transferred to the common delay line 300A when it is latched.

To be specific, while the detection operation control signal 1tck_LOCK applied to the first delay control code generation circuit 3244A is enabled, the value of the first delay control code FDLY_CODE1<0:N> is increased. At this time, the first operation control signal UPDATE1 is in an enabling state and thus the first delay control code FDLY_CODE1<0:N> which is increased is transferred to the common delay line 300A. Therefore, it is used to gradually increase the delay amount of the common delay line 300A and the phase difference between the source clock REFCLK inputted to the common delay line 300A and the delay locked clock DLLCLK outputted from the common delay line 300A is increased gradually.

Conversely, while the detection operation control signal 1tck_LOCK is disabled, the value of the first delay control code FDLY_CODE1<0:N> is latched as it is. At this time, the first operation control signal UPDATE1 is disabled, too. Therefore, the first delay control code FDLY_CODE1<0:N> is not used for varying the delay amount of the common delay line 300A, and the delay amount of the common delay line 300A comes to have no connection with the value of the first delay control code FDLY_CODE1<0:N>, and the phase difference between the source clock REFCLK the delay locked clock DLLCLK becomes to have no connection with the value of the first delay control code FDLY_CODE1<0:N> as well.

Among the constituent elements of the clock cycle detector 320A, the logic level detection unit 326 enables the detection operation control signal 1tck_LOCK in response to a 1tck cycle detection mode entry control signal 1tck_MD_ENTRY and disables the detection operation control signal 1tck_LOCK in response to the first delay amount increase/decrease signal UP_DN1 transitioning to a predetermined logic level, wherein the first delay amount increase/decrease signal UP_DN1 may be set to transition from a logic high level to a logic low level or transition from a logic low level to a logic high level.

Here, the factor that decides whether to enable the 1tck cycle detection mode entry control signal 1tck_MD_ENTRY may be different according to embodiments of the present invention. For example, in a semiconductor device such as a Dynamic Random Access Memory (DRAM) device, whether to enable the 1tck cycle detection mode entry control signal 1tck_MD_ENTRY or not may be decided based on whether it is a power down mode or not, whether an auto refresh operation is performed or not, a signal pre-defined by a mode register set or a signal applied from the outside through a signal input pad.

Also, whether the 1tck cycle detection mode entry control signal 1tck_MD_ENTRY is enabled or not may be decided based on the internal operation of the DLL circuit. For example, the 1tck cycle detection mode entry control signal 1tck_MD_ENTRY may be enabled in response to a predetermined bit of a plurality of bits constituting the second delay control code FDLY_CODE2<0:N>, for example, the first bit FDLY_CODE2<0>.

As described above, the logic level detection unit 326 enters the 1tck cycle detection mode by enabling the detection operation control signal 1tck_LOCK in response to the enablement of the 1tck cycle detection mode entry control signal 1tck_MD_ENTRY. Once the detection operation control signal 1tck_LOCK is enabled, it is not disabled until the first delay amount increase/decrease signal UP_DN1 transitions to a predetermined logic level. Therefore, by the time when a mode is changed from the lick cycle detection mode to the delay lock mode, the value of the first delay control code FDLY_CODE1<0:N> is determined by detecting one cycle lick of the source clock REFCLK.

Also, when the lick cycle detection mode entry control signal 1tck_MD_ENTRY is enabled and the logic level detection unit 326 enters the 1tck cycle detection mode, the value of the first delay control code FDLY_CODE1<0:N> is to be initialized to have the minimum value. Thus, the first delay control code generation circuit 3244A may be initialized in response to the enablement of the 1tck cycle detection mode entry control signal 1tck_MD_ENTRY.

Combining the operations of the constituent elements included in the clock cycle detector 320A, the operation of detecting one cycle 1tck of the source clock REFCLK is described in detail as follows.

First, since the clock cycle detector 320A has already entered the 1tck cycle detection mode and the detection operation control signal 1tck_LOCK and the first operation control signal UPDATE1 are already enabled, it is assumed that the output signal PD1 of the first phase comparison unit 322 and the first delay amount increase/decrease signal UP_DN1 are all at a logic high level; the first rising edge of a clock FD_REFDLK outputted from the initial clock delay unit 328A is synchronized with the first rising edge of the delay locked clock DLLCLK within a predetermined range; and the logic level detection unit 326 disables the detection operation control signal 1tck_LOCK when the first delay amount increase/decrease signal UP_DN1 transitions from a logic low level to a logic high level.

In this state, since the output signal PD1 of the first phase comparison unit 322 cannot have a fixed logic level, the first delay amount increase/decrease signal UP_DN1 maintains the logic high level, and the value of the first delay control code FDLY_CODE1<0:N> is increased by a unit delay so that the first rising edge of the delay locked clock DLLCLK is positioned to lag behind the first rising edge of the clock FD_REFDLK outputted from the initial clock delay unit 328A.

Due to the above operation, the output signal PD1 of the first phase comparison unit 322 may be decided to a logic high level, but the logic level of the first delay amount increase/decrease signal UP_DN1 still maintains the logic high level. The value of the first delay control code FDLY_CODE1<0:N> continues to increase so that the first rising edge of the delay locked clock DLLCLK is positioned to lag behind the first falling edge of the clock FD_REFDLK outputted from the initial clock delay unit 328A.

Due to the above operation, the output signal PD1 of the first phase comparison unit 322 may be decided to a logic low level. Therefore, the logic level of the first delay amount increase/decrease signal UP_DN1 transitions from a logic high level to a logic low level, too. However, since it does not satisfy the conditions for enabling the detection operation control signal 1tck_LOCK, the detection operation control signal 1tck_LOCK maintains the disabling state. Thus, the value of the first delay control code FDLY_CODE1<0:N> continues to increase so that the first rising edge of the delay locked clock DLLCLK is synchronized with the second rising edge of the clock FD_REFDLK outputted from the initial clock delay unit 328A within a predetermined range.

When the first rising edge of the delay locked clock DLLCLK is synchronized with the second rising edge of the clock FD_REFDLK outputted from the initial clock delay unit 328A within a predetermined range as described above, the first delay amount increase/decrease signal UP_DN1 transitions from a logic low level to a logic high level because the output signal PD1 of the first phase comparison unit 322 may be decided to a logic high level. The logic level transition operation of the first delay amount increase/decrease signal UP_DN1 satisfies the condition for enabling the detection operation control signal 1tck_LOCK, and the detection operation control signal 1tck_LOCK transitions from the disabling state to an enabling state. Therefore, the value of the first delay control code FDLY_CODE1<0:N> is not increased anymore but latched.

In consequence, the first delay control code FDLY_CODE1<0:N> whose value is decided based on the operation of the clock cycle detector 320A may be a value corresponding/equivalent to one cycle 1tck of the source clock REFCLK.

Among the constituent elements of the delay amount controller 340A, the second phase comparison unit 342 operates to detect the logic level of the source clock REFCLK at a predetermined edge of the feedback clock FBCLK, which generally means a rising edge but may be a falling edge according to embodiments of the present invention.

Also, among the constituent elements of the delay amount controller 340A, the second code generation operation control circuit 3444 in the second code varying unit 344A simultaneously performs the first operation of controlling the second operation control signal UPDATE2 to have an opposite enabled duration to that of the detection operation control signal 1tck_LOCK and the second operation of filtering the output signal PD2 of the second phase comparison unit 342 and outputting the second delay amount increase/decrease signal UP_DN2.

To have a look at the first operation, the second operation control signal UPDATE2 is controlled to maintain an enabling state in response to the detection operation control signal 1tck_LOCK maintaining a disabling state in an operation duration of the delay locking mode. Conversely, the second operation control signal UPDATE2 is controlled to maintain a disabling state in response to the detection operation control signal 1tck_LOCK maintaining an enabling state in an operation duration of the 1tck cycle detection mode. In short, when the detection operation control signal 1tck- _LOCK is disabled and an operation for delay locking the phases of the source clock REFCLK and the feedback clock FBCLK needs to be performed, the second operation control signal UPDATE2 is enabled so that the second delay control code FDLY_CODE2<0:N> varies according to the output signal PD2 of the second phase comparison unit 342.

Similarly, to have a look at the second operation, the output signal PD2 of the second phase comparison unit 342 is filtered and outputted as the second delay amount increase/decrease signal UP_DN2. Here, the filtering operation is an operation that may be configured differently according to the different design needs. For example, the second delay amount increase/decrease signal UP_DN2 of a logic low level may be set to transition to a logic high level when the output signal PD2 of the second phase comparison unit 342 becomes a logic high level in three consecutive times while the phases of the source clock REFCLK and the feedback clock FBCLK are not changed. At this time, if the output signal PD2 of the second phase comparison unit 342 transitions to a logic high level once or twice and then maintains the logic low level, the second delay amount increase/decrease signal UP_DN2 is maintained at the logic low level. In short, the filtering operation is performed to prevent the operation errors of the second phase comparison unit 342 caused by several environment reasons from affecting the operation of the second code varying unit 344A. Of course, the output signal PD2 of the second phase comparison unit 342 and the second delay amount increase/decrease signal UP_DN2 may continue to have the same value in the ideal state.

Among the constituent elements of the delay amount controller 340A, the second delay control code generation circuit 3442A in the second code varying unit 344A varies the value of the second delay control code FDLY_CODE2<0:N> in response to the second delay amount increase/decrease signal UP_DN2. Here, the second delay control code generation circuit 3442A varies the value of the second delay control code FDLY_CODE2<0:N> by the value of the first delay control code FDLY_CODE1<0:N> in response to the cycle control signals CODE_SET and CODE_RESET. Also, the second delay control code generation circuit 3442A transfers the second delay control code FDLY_CODE2<0:N> to the common delay line 300A during the enablement of the second operation control signal UPDATE2. Here, since the second operation control signal UPDATE2 is controlled to have the opposite enabled duration to that of the detection operation control signal 1tck_LOCK in the second code generation operation control circuit 3444, the second delay control code FDLY_CODE2<0:N> is transferred to the common delay line 300A when it is changed, and when the second delay control code FDLY_CODE2<0:N> is not changed, it is not transferred to the common delay line 300A.

To be specific, the value of the second delay control code FDLY_CODE2<0:N> may be selectively increased or decreased according to what logic level the second delay amount increase/decrease signal UP_DN2, which is applied to the second delay control code generation circuit 3442A, has. As described above, when the value of the second delay control code FDLY_CODE2<0:N> is varied and the second operation control signal UPDATE2 is in an enabling state, the second delay control code FDLY_CODE2<0:N> is transferred to the common delay line 300A and used to change the delay amount of the common delay line 300A. Therefore, the phase difference between the delay locked clock DLLCLK and the source clock REFCLK inputted/outputted to/from the common delay line 300A is changed, too. However, although the value of the second delay control code FDLY_CODE2<0:N> is changed, if the second operation control signal UPDATE2 is in a disabling state, the second delay control code FDLY_CODE2<0:N> is not transferred to the common delay line 300A and not used for changing the delay amount of the common delay line 300A. Therefore, the value of the second delay control code FDLY_CODE2<0:N> does not affect changing the phase difference between the delay locked clock DLLCLK and the source clock REFCLK inputted/outputted to/from the common delay line 300A.

Also, besides varying in response to the logic level of the second delay amount increase/decrease signal UP_DN2 as described above, the value of the second delay control code FDLY_CODE2<0:N> may be changed by the value of the first delay control code FDLY_CODE1<0:N> at once according to the values of the cycle control signals CODE_SET and CODE_RESET. This will be described again after the operation of the code comparison unit 346 is described hereafter.

Among the constituent elements of the delay amount controller 340A, the code comparison unit 346 makes the reset signal CODE_RESET toggle in response to the first and second delay control codes FDLY_CODE1<0:N> FDLY_CODE2<0:N> having the same value and makes the set signal CODE_SET toggle in response to the second delay control code FDLY_CODE2<0:N> having the minimum value.

Here, the operation of the code comparison unit 346 may be performed properly, when the first delay control code FDLY_CODE1<0:N> has latched the value corresponding to one cycle 1tck of the source clock REFCLK as described in the operation of the clock cycle detector 320A. In short, the operation of the clock cycle detector 320A is to be completed before the code comparison unit 346 operates.

To describe the operation of the code comparison unit 346 under the above described state, the second delay control code FDLY_CODE2<0:N> having the same value as the value of the first delay control code FDLY_CODE1<0:N> signifies that the delay locked clock DLLCLK and the source clock REFCLK inputted/outputted to/from the common delay line 300A have a phase difference corresponding/equivalent to one cycle 1tck of the source clock REFCLK. Therefore, as the reset signal CODE_RESET starts to toggle in response to the second delay control code FDLY_CODE2<0:N> having the same value as the value of the first delay control code FDLY_CODE1<0:N>, the value of the second delay control code FDLY_CODE2<0:N> is reset to the minimum value. That is, the value of the second delay control code FDLY_CODE2<0:N> is decreased by the value of the first delay control code FDLY_CODE1<0:N>.

As a result of the change in the value of the second delay control code FDLY_CODE2<0:N> described above, the phase of the delay locked clock DLLCLK and the phase of the feedback clock FBCLK are moved forward by one cycle 1tck of the source clock REFCLK.

Conversely, the fact that the value of the second delay control code FDLY_CODE2<0:N> is the same as the minimum value means that the delay locked clock DLLCLK and the source clock REFCLK inputted/outputted to/from the common delay line 300A are synchronized within a predetermined range. Therefore, as the set signal CODE_SET start to toggle in response to the second delay control code FDLY_CODE2<0:N> having the minimum value, the value of the second delay control code FDLY_CODE2<0:N> is made to be the same as the value of the first delay control code FDLY_CODE1<0:N>. That is, the value of the second delay control code FDLY_CODE2<0:N> is increased up to the value of the first delay control code FDLY_CODE1<0:N>.

As shown above, as the value of the second delay control code FDLY_CODE2<0:N> is changed, the phase of the delay locked clock DLLCLK and the phase of the feedback clock FBCLK may be moved backward by one cycle 1tck of the source clock REFCLK.

Referring to FIG. 3B, a DLL circuit in accordance with another embodiment of the present invention includes a common delay line 300B, a clock cycle detector 320B, a delay replica modeler 360, a delay amount controller 340B, and a duty cycle corrector 380, as the DLL circuit illustrated in FIG. 3A in accordance with the embodiment of the present invention.

The DLL circuit of FIG. 3B may include a first delay control code generation circuit 3244B, an initial clock delay unit 328B, a second delay control code generation circuit 3442B, and a common delay line 300B in a different structure from corresponding elements of FIG. 3B.

First, to have a look at the structure of the common delay line 300B, the common delay line 300B includes a plurality of delay units CUD0, CUD1, CUD2, CU3, CUD4, CUD5, ..., CUDN−1, CUDN which are coupled with each other in the form of chain and receive the source clock REFCLK applied through the first delay control code generation circuit 3244B among the constituent elements of a first code varying unit 324B or the second delay control code generation circuit 3442B among the constituent elements of a second code varying unit 344B in response to the first delay control code FDLY_CODE1<0:N> or the second delay control code FDLY_CODE2<0:N>.

Also, each of the first delay control code generation circuit 3244B and the second delay control code generation circuit 3442B controls the delay amount of the common delay line 300B by receiving the source clock REFCLK directly and selecting a delay unit among the delay units CUD0, CUD1, CUD2, CU3, CUD4, CUD5, ..., CUDN−1, CUDN of the common delay line 300B to which the received source clock REFCLK is to be transferred.

To have a close look at the operation of the common delay line 300B, each of the delay units CUD0, CUD1, CUD2, CU3, CUD4, CUD5, ..., CUDN−1, CUDN delays a signal transferred from the following delay unit or the source clock REFCLK by a delay unit CUD, transfers the delayed signal to the previous delay unit, and performs an operation to output the delay locked clock DLLCLK from the foremost delay unit CUD0.

In short, each of the delay units CUD0, CUD1, CUD2, CU3, CUD4, CUD5, ..., CUDN−1, CUDN included in the common delay line 300B delays the source clock REFCLK applied from the first delay control code generation circuit 3244B and the second delay control code generation circuit 3442B by a delay unit CUD in response to the first delay control code FDLY_CODE1<0:N> or the second delay control code FDLY_CODE2<0:N> and transfers the delayed source clock to the previous delay unit or transfers a clock applied from the following delay unit to the previous delay unit.

For example, if the common delay line 300B is to operate to delay the source clock REFCLK by a delay amount of 5*delay unit (5*CUD) and output a delay locked clock DLLCLK, the fourth bit FDLY_CODE1<4> or FDLY_CODE2<4> of the first delay control code FDLY_CODE1<0:N> or the second delay control code FDLY_CODE2<0:N> is enabled and the other bits FDLY_CODE1<0:3> and FDLY_CODE1<5:N>, or FDLY_CODE2<0:3> and FDLY_CODE2<5:N> are disabled. Therefore, the source clock REFCLK is transferred to the fourth delay unit CUD4 among the delay units CUD0, CUD1, CUD2, CU3, CUD4, CUD5, ..., CUDN−1, CUDN through the first delay control code generation circuit 3244B or the second delay control code generation circuit 3442B, and the fourth delay unit CUD4 delays the source clock REFCLK by the delay unit CUD and transfers the delayed source clock to the third delay unit CUD3. The zeroth to third delay units CUD0, CUD1, CUD2, and CU3 delays a clock transferred from the following delay units CUD1, CUD2, CU3, and CUD4 by a delay unit and transfers the delayed clock to the previous delay units CUD0, CUD1, and CUD2 and a signal output end OUTND. The other delay units CUD5, CUD6, ..., CUDN−1, and CUDN are controlled not to perform any operation. Here, the other delay units CUD5, CUD6, ..., CUDN−1, and CUDN are not included in the path through which the source clock REFCLK passes, they do not have any influence on delaying the source clock REFCLK.

The initial clock delay unit 328B among the constituent elements of a clock cycle detector 320B may have a different structure due to a change in a delay amount varying method of the common delay line 300B. In other words, the initial clock delay unit 328B illustrated in FIG. 3B delays the source clock REFCLK by a delay amount obtained by adding up the delay amount of a predetermined number of delay units, which is the dame as the delay amount of the number of delay units of the common delay line 300B in response to the minimum value of the first delay control code FDLY_CODE1<0:N>, and the delay amount of the first code varying unit 324B and transfers the delayed source clock FD_REFCLK to the first phase comparison unit 322.

FIG. 4 is a timing diagram illustrating the DLL operations of the DLL circuits of the semiconductor device shown in FIGS. 3A and 3B.

Referring to FIG. 4, the DLL circuit in accordance with the embodiment of the present invention performs an operation of varying the delay amount $t_{VAR}$ of the common delay line 300A and 300B (i.e., variable delay in the drawing) so that the feedback clock FBCLK have the same phase as the source clock REFCLK when the source clock REFCLK applied as the delay locked clock DLLCLK is outputted as the feedback clock FBCLK after passing through the common delay line 300A and 300B (the delay amount $t_{VAR}$ and the delay replica modeler 360 (the delay amount $t_{REP}$).

Here, the delay amount $t_{REP}$ of the delay replica modeler 360 (i.e., replica delay in the drawing) may be set a predetermined fixed value in the stage of design. However, the delay amount $t_{REP}$ of the delay replica modeler 360 may change according to the level of an external power source voltage VDD.

To be specific, FIG. 4 shows the timing diagrams of the source and feedback clocks REFCLK and FBCLK according to a level of an external power source voltage when a delay lock operation is completed and the delay amount $t_{VAR}$ of the common delay line 300A and 300B and the delay amount $t_{REP}$ of the delay replica modeler 360 are determined in the DLL.

First, when the DLL circuit operates with an external power source voltage HIGH VDD having a higher voltage level than a target level due to a change in the process, voltage and/or temperature (PVT), the delay amount $t_{REP}$ of the delay replica modeler 360 may become relatively small. Therefore, the DLL circuit performs a delay locking operation in such as manner that the delay amount $t_{VAR}$ of the common delay line 300A and 300B has a relatively great value so that the phase of the feedback clock FBCLK is the same as the phase of the source clock REFCLK.

Conversely, when the DLL circuit operates with an external power source voltage HIGH VDD having a lower voltage level than the target level due to a change in the process, voltage and/or temperature (PVT), the delay amount $t_{REP}$ of the delay replica modeler 360 may become relatively large.

Therefore, the DLL circuit performs a delay locking operation in such a manner that the delay amount $t_{VAR}$ of the common delay line 300A and 300B has a relatively small value so that the phase of the feedback clock FBCLK is the same as the phase of the source clock REFCLK.

However, as illustrated in the drawing, the delay amount $t_{REP}$ of the delay replica modeler 360 becomes too great and thus the phase of the feedback clock FBCLK and the phase of the source clock REFCLK do not match each other although the delay amount $t_{VAR}$ of the common delay line 300A and 300B is maintained at the minimum variable delay level (refer to a state 'A').

In this state, among the constituent elements of the DLL circuit in accordance with the embodiment of the present invention, the delay amount controller 340A and 340B detects that the delay amount $t_{VAR}$ of the common delay line 300A and 300B becomes the minimum variable delay level, and performs an operation of increasing (refer to a state 'B') the delay amount $t_{VAR}$ of the common delay line 300A and 300B by one cycle 1tck of the source clock REFCLK and decreasing the delay amount $t_{VAR}$ of the common delay line 300A and 300B by a delay unit so that the phase of the feedback clock FBCLK may be the same as the phase of the source clock REFCLK at the end (refer to a state 'C').

Here, since the delay amount $t_{VAR}$ of the common delay line 300A and 300B is extended by one cycle 1tck of the source clock REFCLK by the delay amount controller 340A and 340B, the phases of the feedback clock FBCLK and the source clock REFCLK match at the position of one cycle 1tck behind, compared with other timing diagram.

As described above, the DLL circuit in accordance with the embodiment of the present invention operates to increase the delay amount $t_{VAR}$ of the common delay line 300A and 300B by one cycle 1tck of the source clock REFCLK, when the delay amount $t_{REP}$ of the delay replica modeler 360 becomes too great and thus the phases of the feedback clock FBCLK and the source clock REFCLK do not match each other although the delay amount of the common delay line 300A and 300B is maintained at the minimum variable delay level. In this way, the phases of the feedback clock FBCLK and the source clock REFCLK may be adjusted to match each other even when the delay amount $t_{REP}$ of the delay replica modeler 360 is increased more than a limit range of the circuit design.

Although not directly illustrated in the drawing, when the DLL circuit operates with an external power source voltage HIGH VDD having a higher voltage level than the target level due to a change in the process, voltage, and/or temperature (PVT), the delay amount $t_{REP}$ of the delay replica modeler 360 may become too small and thus the phases of the feedback clock FBCLK and the source clock REFCLK may not match although the delay amount $t_{VAR}$ of the common delay line 300A and 300B is maintained at the maximum variable delay level. In this case, too, the DLL circuit in accordance with the embodiment of the present invention operates in such a manner that the delay amount $t_{VAR}$ of the common delay line 300A and 300B is decreased by one cycle 1tck of the source clock REFCLK. In this way, the phases of the feedback clock FBCLK and the source clock REFCLK may be adjusted to match each other even when the delay amount $t_{REP}$ of the delay replica modeler 360 is decreased less than a limit range of the circuit design.

According to the embodiment of the present invention described above, the delay amount of the common delay line 300A and 300B may be changed regardless of the physical size, e.g., circuit size, by logically increasing/decreasing the delay amount $t_{VAR}$ of the common delay line 300A and 300B by one cycle 1tck of the source clock REFCLK, although the delay amount $t_{REP}$ of the delay replica modeler 360 is changed beyond a tolerance range due to diverse reasons including a change in the process, voltage, and/or temperature (PVT) during the operation of the DLL circuit.

Therefore, the DLL circuit may prevent stuck failure from occurring therein.

According to an embodiment of the present invention, the delay amount of a common delay line may be changed regardless of the physical size by logically increasing/decreasing the delay amount $t_{VAR}$ of a variable common delay line through a delay locked loop operation by a delay amount corresponding to one cycle 1 tck of a source clock REFCLK, although the delay amount $t_{REP}$ of a delay replica modeler is changed more than a tolerance range due to diverse reasons including a change in process, voltage, and/or temperature during the operation of a DLL circuit.

Therefore, the stuck failure is prevented from occurring in the DLL circuit.

While the present invention has been described with respect to the specific embodiments, it will be apparent to those skilled in the art that various changes and modifications may be made without departing from the spirit and scope of the invention as defined in the following claims.

For example, although the structure and operation have been described based on the operation of the DLL circuit in the above-described embodiment, the operation of an embodiment of the present invention may be applied not only to the DLL circuit but also to a circuit which receives a certain source clock REFCLK, delays the source clock REFCLK by a delay unit, and outputs a delay locked clock DELAY_REFCLK.

Also, the exemplified logic gates and transistors may be realized differently in the positions and kinds according to the polarity of an input signal.

What is claimed is:
1. A delay locked loop (DLL) circuit, comprising:
a common delay line configured to generate a delay locked clock by selectively delaying a source clock by one or more unit delays in response to a first delay control code or a second delay control code;
a clock cycle detector configured to compare a phase of the source clock with a phase of the delay locked clock in a cycle detection mode and generate the first delay control code corresponding to a delay amount of a cycle of the source clock based on a result of comparing the phases of the source and delay locked clocks;
a feedback delay configured to delay the delay locked clock and output a feedback clock; and
a delay amount controller configured to compare the phase of the source clock with a phase of the feedback clock in a delay locking mode and change the second delay control code based on a result of comparing the source and feedback clocks.

2. The DLL circuit of claim 1, wherein the delay amount controller is configured to increase and decrease a value of the second delay control code by a value of the first delay control code when the value of the second delay control code reaches minimum and maximum values, respectively.

3. The DLL circuit of claim 1, wherein the clock cycle detector comprises:
a first phase comparison unit configured to compare the phase of the source clock with the phase of the delay locked clock;
a first code varying unit configured to change the first delay control code in response to an output signal of the first phase comparison unit in an enabled period of a detection operation control signal which is enabled for the cycle detection mode; and a logic level detection unit configured to detect a logic level of an output signal of the first code varying unit and enable the detection operation control signal based on the detected logic level.

4. The DLL circuit of claim 3, wherein the delay amount controller comprises:

a second phase comparison unit configured to compare the phase of the source clock with the phase of the feedback clock;

a second code varying unit configured to change the second delay control code in response to a cycle control signal and an output signal of the second phase comparison unit in a disabled period of the detection operation control signal; and a code comparison unit configured to compare the first delay control code with the second delay control code and decide a value of the cycle control signal based on a result of comparing the first and second control codes.

5. The DLL circuit of claim 4, wherein the first code varying unit comprises:

a first delay control code generation circuit configured to increase a value of the first delay control code in the enabled period of the detection operation control signal, latch the value of the first delay control code in the disablement period of the detection operation control signal, and transfer the first delay control code to the common delay line in an enabled period of a first operation control code; and a first code generation operation control circuit configured to control the first operation control signal to have the same enabled period as the detection operation control signal and output a first delay amount change signal by filtering the output signal of the first phase comparison unit.

6. The DLL circuit of claim 5, wherein the second code varying unit comprises:

a second delay control code generation circuit configured to change a value of the second delay control code in response to a second delay amount change signal, wherein the value of the second delay control code is changed by the value of the first delay control code in response to the cycle control signal, and transfer the second delay control code to the common delay line in an enabled period of a second operation control signal; and a second code generation operation control circuit configured to control the second operation control signal to have an opposite enabled period to the detection operation control signal and output the second delay amount change signal by filtering an output signal of the second phase comparison unit.

7. The DLL circuit of claim 6, wherein the logic level detection unit is configured to enable the detection operation control signal in response to a cycle detection mode entry control signal and disable the detection operation control signal in response to the transition of the first delay amount change signal to a predetermined logic level.

8. The DLL circuit of claim 7, wherein the first delay control code generation circuit is configured to be initialized in response to the cycle detection mode entry control signal.

9. The DLL circuit of claim 8, wherein the cycle detection mode entry control signal is enabled in response to a power down mode entry control signal, an auto refresh operation control signal, a signal set in a mode register set, or an external signal applied through a signal input pad.

10. The DLL circuit of claim 8, wherein the cycle detection mode entry control signal is enabled, in response to a selected bit value of the second delay control code which includes a plurality of bits.

11. The DLL circuit of claim 7, wherein the code comparison unit is configured to control a reset signal to toggle as the cycle control signal in response to the first and second delay control codes having the same value and a set signal to toggle as the cycle control signal in response to the second delay control code having a minimum value.

12. The DLL circuit of claim 11, wherein the second delay control code generation circuit is configured to set the value of the second delay control code as the value of the first delay control code in response to the toggling of the set signal of the cycle control signal and sets the value of the second delay control code as the minimum value in response to the toggling of the reset signal of the cycle control signal.

13. The DLL circuit of claim 4, wherein the common delay line comprises a plurality of delaying units which are coupled in a chain and are configured to control a direction of transferring an input signal in response to the first delay control code or the second delay control code, wherein each of the delaying units delays a signal applied from a preceding delay unit by a unit delay to transfer a delayed signal to the preceding delay unit or a following delay unit, and delays a signal applied from the following delay unit by a unit delay to transfer a delayed signal to the preceding delay unit, where the source clock is inputted through a foremost delay unit and the delay locked clock is outputted through the foremost delay unit.

14. The DLL circuit of claim 13, wherein the clock cycle detector further comprises:

an initial clock delay unit configured to delay the source clock by one or more of the unit delays, which is the same as a delay amount of a number of the delaying units of the common delay line corresponding to the minimum value of the first delay control code, and transfer a delayed source clock to the first phase comparison unit.

15. The DLL circuit of claim 4, wherein the common delay line comprises a plurality of delaying units which are coupled in a chain, wherein each of the delaying units is configured to selectively receive the source clock applied through the first code varying unit or the second code varying unit in response to the first delay control code or the second delay control code, delay the received source clock or a signal applied from a subsequent delay unit by a unit delay, and transfer a delayed signal to a preceding delay unit, where a foremost delay unit of the delaying units is configured to output the delay locked clock.

16. The DLL circuit of claim 15, wherein the clock cycle detector further comprises:

an initial clock delay unit configured to delay the source clock by a delay amount obtained by adding up a delay amount of a number of delaying units of the common delay line corresponding to a minimum value of the first delay control code and a delay amount of the first code varying unit and transfer a delayed source clock to the first phase comparison unit.

* * * * *